(12) United States Patent
Wieberneit et al.

(10) Patent No.: US 6,346,836 B1
(45) Date of Patent: Feb. 12, 2002

(54) SYNCHRONIZING STAGE

(75) Inventors: Dirk Wieberneit, Unterhaching; Wilhelm Schmid, Ingolstadt, both of (DE)

(73) Assignee: Infineon Technologies, Munich (DE)

( * ) Notice: Subject to any disclaimer, the term of this patent is extended or adjusted under 35 U.S.C. 154(b) by 0 days.

(21) Appl. No.: 09/540,938

(22) Filed: Mar. 31, 2000

(30) Foreign Application Priority Data

Mar. 31, 1999 (DE) ........................... 299 05 904 U

(51) Int. Cl.$^7$ ................................. H03L 7/00
(52) U.S. Cl. ............... 327/144; 327/161; 327/201; 327/214; 327/404; 326/94; 326/97
(58) Field of Search .................. 327/141, 142, 327/144, 153, 198, 210–212, 191, 200–203, 214, 403, 404, 291, 293, 294; 375/354, 359; 365/189.05, 233; 326/93–98

(56) References Cited

U.S. PATENT DOCUMENTS 5,760,627 A * 6/1998 Gregor et al. .............. 327/215
5,796,675 A * 8/1998 Jang ....................... 365/230.08
6,072,346 A * 6/2000 Ghahremani ............... 327/198

* cited by examiner

Primary Examiner—Timothy P. Callahan
Assistant Examiner—Minh Nguyen
(74) Attorney, Agent, or Firm—Herbert L. Lerner; Laurence A. Greenberg; Werner H. Stemer

(57) ABSTRACT

A synchronizing stage for synchronizing asynchronous signals provides for a signal stage to be connected in parallel with a clocked input stage and a holding stage that is clocked in anti-phase. The signal stage is clocked in anti-phase with the input stage. An output stage is connected downstream of the parallel circuit. The synchronizing stage reduces the probability of a metastable state in the event of overlapping and non-overlapping clock signals and ensures the reliable transfer of an input datum to the output of the synchronizing stage.

7 Claims, 2 Drawing Sheets

SYNCHRONIZING STAGE

BACKGROUND OF THE INVENTION

Field of the Invention

The invention relates to a synchronizing stage for synchronizing asynchronous signals, having a clocked input stage, an output stage and a holding stage.

A synchronizing stage of this type has the task of synchronizing an asynchronous input datum, with a clock signal. For this purpose, use is typically made of holding stages which buffer-store the input signal until it can be synchronized by a clock signal. A plurality of cascaded holding stages (a latch) are suitable. However, it is often the case that such two-stage or three-stage synchronization is not possible and it would be desirable to manage with one synchronizing stage. A single-stage configuration is known in which an input signal and a clock signal are applied to an input stage. A holding stage containing two negative feedback inverters is connected downstream of the input stage. The input of an output stage is connected downstream of the junction point between the input stage and the holding stage, the output stage providing the output signal at its output. The input and output stages are normally inverters. Difficulties can arise if the input signal and the clock signal change over simultaneously. In this case, it can happen that the input signal is not transferred to the output, because the switching speeds of the individual stages of the synchronizing stage are finite and the switching thresholds are different. So-called metastable states can arise, in which a momentary signal change takes place at the output but afterwards, on account of the parasitic physical properties of the synchronizing stage, an intrinsically false signal is present (so-called spikes). In the realization of a synchronizing stage, therefore, it is necessary to keep the probability of a metastable state low.

SUMMARY OF THE INVENTION

It is accordingly an object of the invention to provide a synchronizing stage which overcomes the above-mentioned disadvantages of the prior art devices of this general type, which synchronizes asynchronous signals and takes up little space in an integrated semiconductor circuit and keeps the probability of metastable states low in the event of signal and clock-signal changeovers.

With the foregoing and other objects in view there is provided, in accordance with the invention, a synchronizing stage for synchronizing asynchronous signals, including a clocked input stage; an output stage; a holding stage connected serially between the clocked input stage and the output stage and being clocked in an anti-phase fashion; and a signal stage connected in parallel with a circuit formed of the input stage and the holding stage, the signal stage clocked in anti-phase with respect to the input stage.

In accordance with an added feature of the invention, the output stage is an inverter or a Schmitt triggers.

In accordance with another feature of the invention, the holding stage clocked in anti-phase receives a clock signal and an anti-phase clock signal, the anti-phase clock signal is generated by inverting the clock signal.

In accordance with an additional feature of the invention, the input stage is an inverter and/or the holding stage contains two feedback inverters.

In accordance with a concomitant feature of the invention, the signal stage contains two series-connected inverters, including an upstream inverter and a clocked downstream inverter.

Other features which are considered as characteristic for the invention are set forth in the appended claims.

Although the invention is illustrated and described herein as embodied in a synchronizing stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
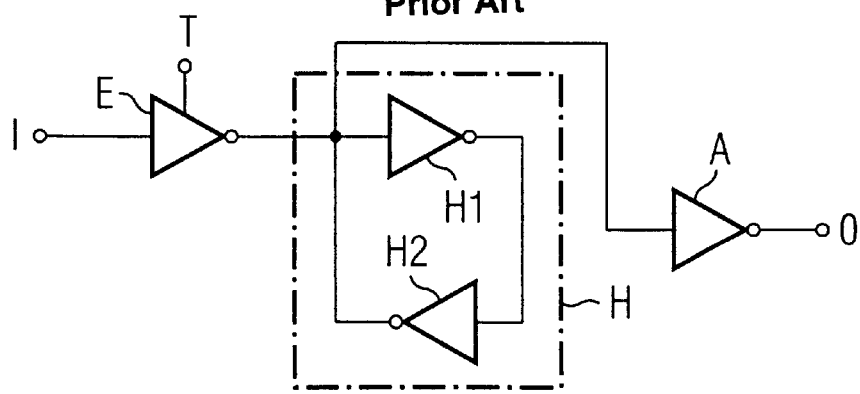
FIG. 4 is a circuit diagram of a known single-stage synchronizing stage.

In all the figures of the drawing, sub-features and integral parts that correspond to one another bear the same reference symbol in each case. Referring now to the figures of the drawing in detail and first, particularly, to FIG. 4 thereof, there is shown a known single-stage configuration. In this case, an input signal I and a clock signal T are applied to an input stage E. A holding stage H containing two negative feedback inverters H1 and H2 is connected downstream of the input stage E. An input of an output stage A is connected downstream of a junction point between the input stage E and the holding stage H, the output stage A providing an output signal at its output O. The input and output stages are normally formed of inverters.

Difficulties can arise if the input signal I and the clock signal T change over simultaneously. In this case, it can happen that the input signal I is not transferred to the output O, because the switching speeds of the individual stages of the synchronizing stage are finite and the switching thresholds are different. So-called metastable states can arise, in which a momentary signal change takes place at the output but afterwards, on account of the parasitic physical properties of the synchronizing stage, an intrinsically false signal is present (so-called spikes). In the realization of a synchronizing stage, therefore, it is necessary to keep the probability of a metastable state low.

Figure 1:
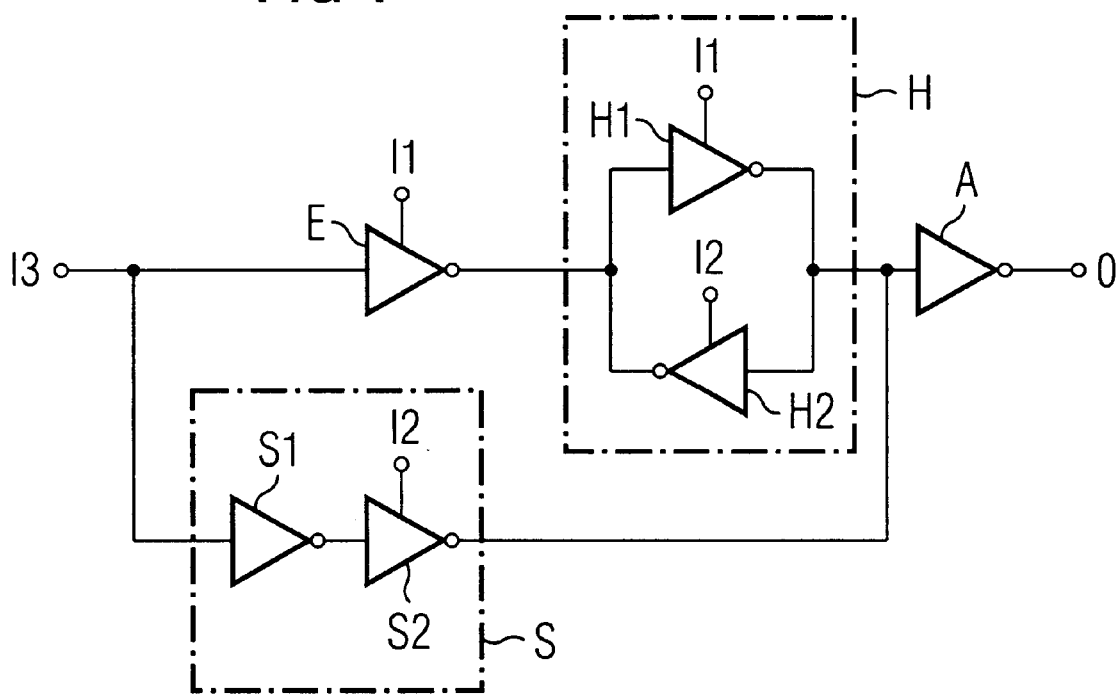
FIG. 1 is a basic circuit diagram of a synchronizing stage according to the invention.

FIG. 1 shows a synchronizing stage according to the invention. The input stage E and the holding stage H are connected in series and define a series circuit. A signal stage S is connected in parallel with the series circuit. The holding stage H contains the two negative feedback inverters or amplifiers H1 and H2. The signal stage S contains two inverters S1 and S2. The input stage E and the signal stage S are connected to an input terminal I3, which receives an input datum signal. The output stage A is connected downstream of a common output terminal of the holding stage H and of the signal stage S, an output of the output A stage being connected to the output terminal O. The output stage A may be realized either as an inverter or as a Schmitt trigger.

The input stage E is clocked by a clock signal I1, and the inverter S2 is clocked by a clock signal I2, which is in anti-phase with I1. In a similar manner HI is clocked by the clock signal I1 and H2 by the clock signal I2. Insofar as the in-anti-phase clock signals are not already present, the first complementary clock signal can be generated from a single clock signal by inversion of the clock signal. For example by a clock signal I1 being connected to an inverter, at whose output the in anti-phase clock signal I2 is available.

Furthermore, the synchronizing stage in accordance with FIG. 1 can be operated with an overlapping clock signal, but also with a non-overlapping clock signal.

The logical function of the synchronizing stage in accordance with FIG. 1 is defined as a latch with an inverted output and two balanced clock inputs.

Experiments show that, in the case of the synchronizing stage according to the invention, the metastable states or beats in the output signal can be reduced by a factor of 3 compared with known synchronizing stages.

Figure 2:
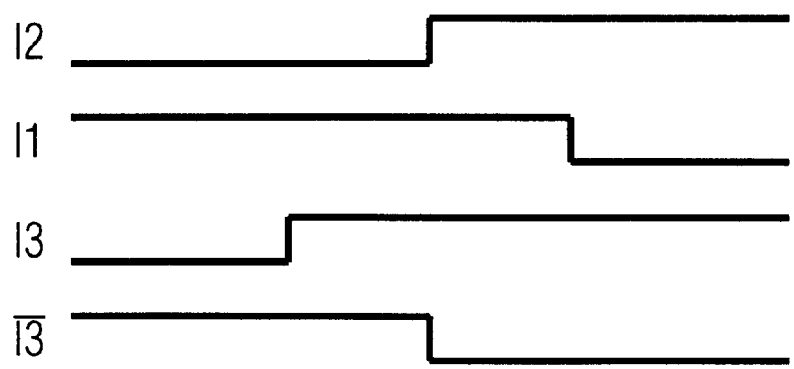
FIG. 2 is a signal diagram for elucidating a method of operation of the synchronizing stage in accordance with FIG. 1.

FIG. 2 shows an example of a datum changeover, in which, for the sake of simplicity, the clock inputs I1 and I2 and the datum input I3 are assigned the signal profiles of the same name. The complementary signal with respect to I3 is correspondingly present at the output of the inverter S1.

Figure 3:
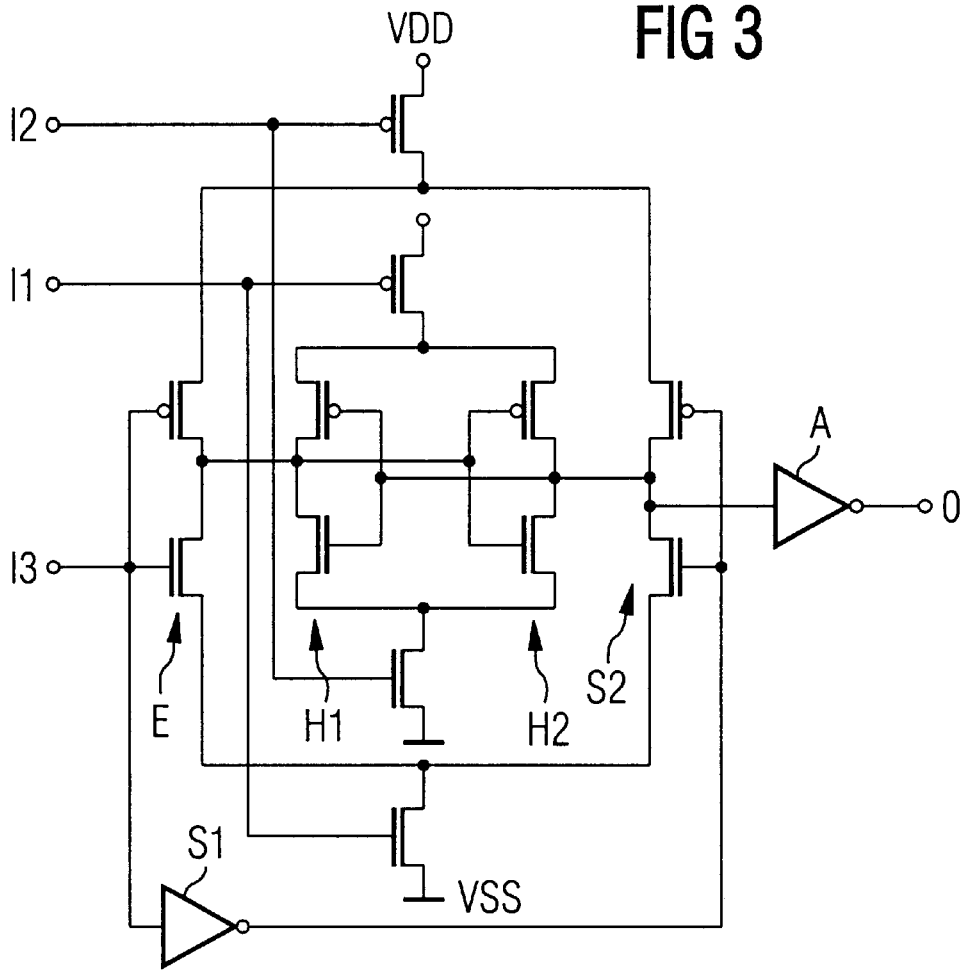
FIG. 3 is a circuit diagram of the synchronizing stage according to the invention at a transistor level.

FIG. 3 shows a realization of the synchronizing stage at a transistor level, where the inverters S1 and A are still illustrated symbolically.

In the case of the complementary clock signals I1 and I2, the logical function of the circuit reads:

$$O_{n+1}=\overline{I3}*I1*\overline{I2}+O_n*\overline{I1}*I2.$$

In the case of low switching thresholds of the inverters using an inverter connected downstream of the synchronizing stage, with a low switching point, the synchronizing stage enables defined output levels even in the metastable state.

We claim:

1. A synchronizing stage for synchronizing asynchronous signals, comprising:
    a clocked input stage having an input terminal being clocked by a first clock signal;
    an output stage having an output terminal;
    a holding stage connected serially between said clocked input stage and said output stage, said holding stage containing two feedback inverters, a first of said two feedback inverters being clocked by the first clock signal, and a second of said two feedback inverters being clocked by a second clock signal, the second clock signal being clocked in anti-phase with the first clock signal; and
    a signal stage connected in parallel with a circuit formed of said in put stage and said holding stage, said signal stage being clocked by the second clock signal.

2. The synchronizing stage according to claim 1, wherein said output stage is selected from the group consisting of inverters and Schmitt triggers.

3. The synchronizing stage according to claim 1, wherein said holding stage receives the first clock signal and the second clock signal is generated by inverting the first clock signal.

4. The synchronizing stage according to claim 1, wherein said input stage is an inverter.

5. The synchronizing stage according to claim 1, wherein said input stage is an inverter and said holding stage contains two feedback inverters.

6. The synchronizing stage according to claim 1, wherein said signal stage contains two series-connected inverters, including an upstream inverter and a clocked downstream inverter.

7. A complementary MOS circuit, comprising:
    synchronizing stage for synchronizing asynchronous signals, including:
        a clocked input stage having an input terminal being clocked by a first clock signal;
        an output stage having an output terminal;
        a holding stage connected serially between said clocked input stage and said output stage, said holding stage containing two feedback inverters, a first of said two feedback inverters being clocked by the first clock signal, and a second of said two feedback inverters being clocked by a second clock signal, the second clock signal being clocked in anti-phase with the first clock signal; and
        a signal stage connected in parallel with a circuit formed of said input stage and said holding stage, said signal stage being clocked by the second clock signal.

* * * * *